(12) United States Patent
Pyeon

(10) Patent No.: US 8,664,748 B2
(45) Date of Patent: Mar. 4, 2014

(54) PACKAGE-LEVEL INTEGRATED CIRCUIT CONNECTION WITHOUT TOP METAL PADS OR BONDING WIRE

(75) Inventor: Hong Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 972 days.

(21) Appl. No.: 12/701,122

(22) Filed: Feb. 5, 2010

(65) Prior Publication Data

US 2011/0037148 A1   Feb. 17, 2011

Related U.S. Application Data

(60) Provisional application No. 61/234,473, filed on Aug. 17, 2009.

(51) Int. Cl.
*H01L 23/544* (2006.01)
*H01L 21/78* (2006.01)

(52) U.S. Cl.
USPC ........... 257/620; 257/678; 257/733; 257/773; 257/E21.499; 257/E21.599

(58) Field of Classification Search
USPC ................................ 257/678–733, 787–796, 257/E23.001–E23.194
See application file for complete search history.

(56) References Cited

U.S. PATENT DOCUMENTS

| 7,245,021 | B2 |   | 7/2007  | Vindasius et al. |         |
|-----------|----|---|---------|------------------|---------|
| 8,319,327 | B2 | * | 11/2012 | Suh              | 257/686 |
| 2005/0101056 | A1 | * | 5/2005 | Song et al. | 438/109 |
| 2007/0102802 | A1 | * | 5/2007 | Kang et al. | 257/686 |
| 2008/0036082 | A1 | * | 2/2008 | Eun | 257/737 |
| 2008/0303131 | A1 |   | 12/2008 | McElrea et al. | |
| 2009/0085224 | A1 | * | 4/2009 | Choi et al. | 257/777 |
| 2009/0108469 | A1 | * | 4/2009 | Kang et al. | 257/777 |
| 2009/0230528 | A1 | * | 9/2009 | McElrea et al. | 257/676 |
| 2010/0052087 | A1 | * | 3/2010 | McElrea et al. | 257/433 |
| 2010/0148345 | A1 | * | 6/2010 | Eckhardt et al. | 257/690 |

* cited by examiner

*Primary Examiner* — Mamadou Diallo
(74) *Attorney, Agent, or Firm* — Harvey Auerback

(57) ABSTRACT

An integrated circuit apparatus is provided with package-level connectivity, between internal electronic circuitry thereof and contact points on a package substrate thereof, without requiring top metal pads or bonding wires.

12 Claims, 3 Drawing Sheets

PACKAGE-LEVEL INTEGRATED CIRCUIT CONNECTION WITHOUT TOP METAL PADS OR BONDING WIRE

This application claims priority under 35 USC 119 to U.S. Provisional Application No. 61/234,473, which was filed on Aug. 17, 2009 and is incorporated herein by reference.

FIELD

This work relates generally to integrated circuits and, more particularly, to package-level connection to the internal circuitry of an integrated circuit.

BACKGROUND

Moore's law has affected the microchip world where many system applications have demanded more functionality and high performance in ever-smaller form factors. The manufacturing cost also has increased since the first process technology of the late 1950's. As shown in FIG. 1, connecting signals to a microchip 11 from package level requires some chip area for metal bond pads 10. The pad size (area) must satisfy requirements of the packaging process and the minimum possible bonding wire diameter. In order to prevent mechanical damage and thermal stress in each corner of the microchip, dummy pads such as 12 are typically provided.

These kinds of factors require chip area to be sacrificed for bond pads. Along with the bond pad area, some space is provided between the pad and the chip edge to avoid cracks near the pad.

Wire bonding requires electrical connection to the pad, and thus a large enough metal pad area to permit safely connecting the bonding wire to the pad. This results in relatively large capacitive and inductive loading from the metal pad area and the bonding wire itself. Although internal transistor sizes have been steadily reduced by innovations in process technology, the pad size and bonding wire diameter have not kept pace with the shrink ratio of the transistors. Due to this unbalanced trend, the relative influence of the capacitive and inductive loading effect of the pad and bonding wire is increasing seriously. This is generally detrimental, and particularly so for high-speed applications.

It is therefore desirable to provide for reducing the capacitive and inductive loading, and the chip area sacrifices, associated with prior art integrated circuit chip connections at the package level.

DETAILED DESCRIPTION

Figure 1:
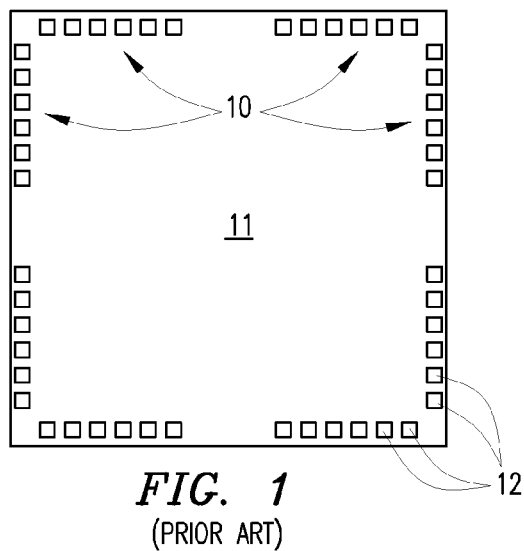
FIG. 1 diagrammatically illustrates a conventional integrated circuit chip with wire bond pads.

Example embodiments of the present work provide lateral pads that replace the conventional wire bonding pads of FIG. 1. (Although the term "lateral pad" is used herein for expository purposes, it will be understood from the following description that "lateral pads" are not structured the same way as the conventional wire bonding pads shown in FIG. 1.) The present work exploits the fact that, when a conventional wafer is sawed (e.g., using a laser) into individual integrated circuit chips or dice, the lateral edges of each individual chip are available to provide access to the internal circuitry of the chip.

Figure 2:
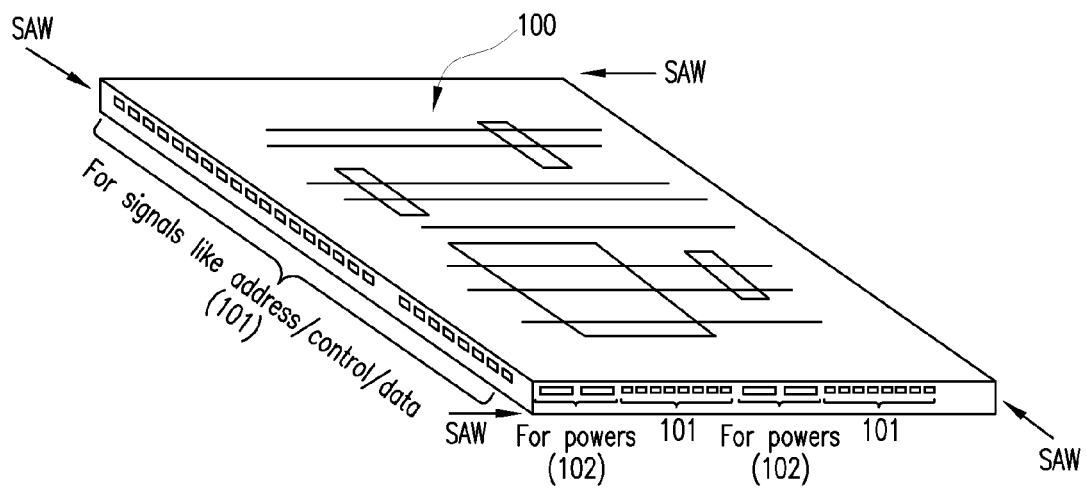
FIGS. 2-6 diagrammatically illustrate integrated circuit apparatus with lateral pad arrangements according to various example embodiments of the present work.

FIG. 2 illustrates lateral pad structures that are accessible at the lateral edges of a chip 100 according to example embodiments of the present work. The lateral pads designated at 101 are for general signals of the chip, such as address, data and control signals. The lateral pads designated at 102 are for power supply, and thus have relatively larger areas (to carry relatively higher current loads) than do the lateral pads 101. No additional wafer processing steps are required to produce the lateral pads 101 and 102. Metal paths on each chip are simply drawn out as needed to the location(s) on the wafer where sawing occurs. The wafer sawing operation (shown diagrammatically in FIG. 2) then exposes the lateral pads 101 and 102 on the chip edge(s) produced by the sawing. The use of lateral pads eliminates processing steps required for conventional wire bonding pads, and the lateral pads do not consume circuit area on the chip as do conventional wire bonding pads.

Table I summarizes characteristics comparisons between lateral pad structure according to the present work and conventional wire bonding pad structure.

TABLE 1

| Characteristic | Lateral pad structure | General pad structure |
| --- | --- | --- |
| Physical pad area | Thickness of available metal layers | Minimum requirement of metal area based on process technology. |
| Capacitive loading of pad | Very small (Allowable metal thickness based capacitive loading) | Pad and metal connection part (at least 1.0 pF) |
| Inductive loading from bonding wire | No bonding wire required. Instead of the bonding wire, additional metal line process is performed. Substantially no inductive loading. | Inductive loading of bonding wire. |
| Pad metal | Any metal layer | Top metal layer |

As shown in Table 1 and explained below, lateral pads do not require conventional bonding wires, and thus eliminate the inductive loading associated with bonding wires. Moreover, as also shown in Table 1 and explained below, the physical size of the lateral pads is determined by the metal layer thicknesses provided by the process, which results in much less capacitive loading than is imposed by conventional wire bonding pads, whose physical size is determined by the minimum metal area requirements of the process and/or the minimum bonding wire diameter. These load reductions provided by lateral pads are particularly advantageous in terms of operating speed and power consumption.

As seen from Table 1, in various embodiments, any of the lateral pads 101 and 102 of FIG. 2 may be part of any of the metal layers of the chip, as may be convenient to facilitate design.

Figure 3:
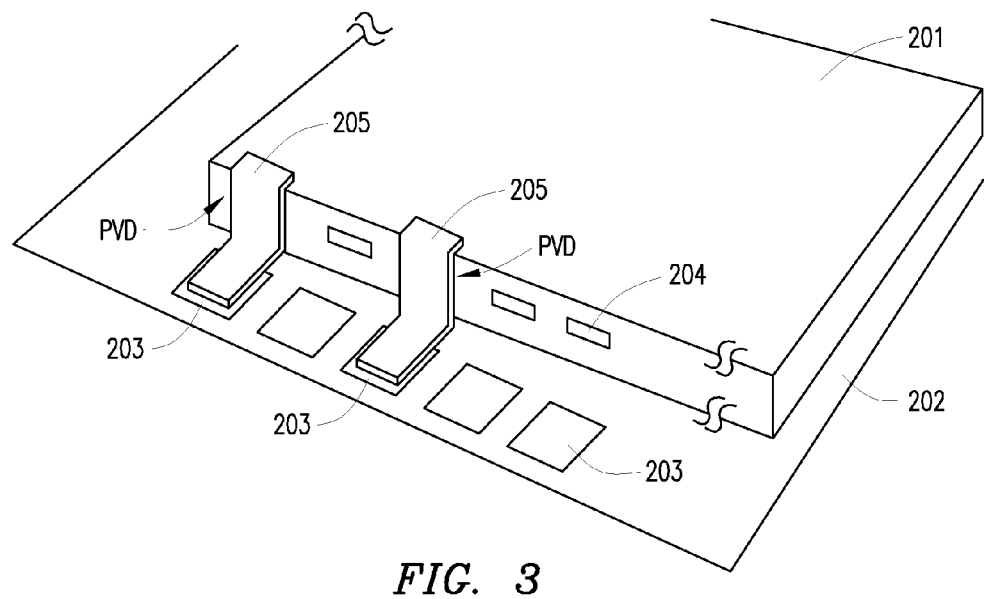

FIG. 3 shows conductive connections at 205 between lateral pads 204 and respectively corresponding contact points 203 on a conventional package substrate 202 according to example embodiments of the present work. The dimensions in FIG. 3 are not shown to scale. In some embodiments, each connection at 205 is provided by a metal mass whose width is approximately the same as the width of the corresponding lateral pad 204, which is simply the metal width of the particular process used to produce the chip 201. The size of the metal mass at 205 may be quite small compared to the size of conventional bonding wire. In some embodiments, the metal mass at 205 is provided by processing similar to the lead processing used for package mounting on conventional integrated circuit boards, the differences being the scale of the metal mass and the material used. In various embodiments, the metal at 205 may be the same as or different from process metal used in the wafer fabrication process. In various embodiments, the metal used at 205 depends on factors such as reliability and cost. As indicated above, any lateral pad may be part of any metal layer used in the chip.

It is common to use a back-grinding process to reduce wafer thickness in order to facilitate stacking multiple chips. However, because the size of the lateral pads depends only on the dimensions of the metal layers in the fabrication process technology, the use of lateral pads does not present technical issues in this environment.

Figure 4:
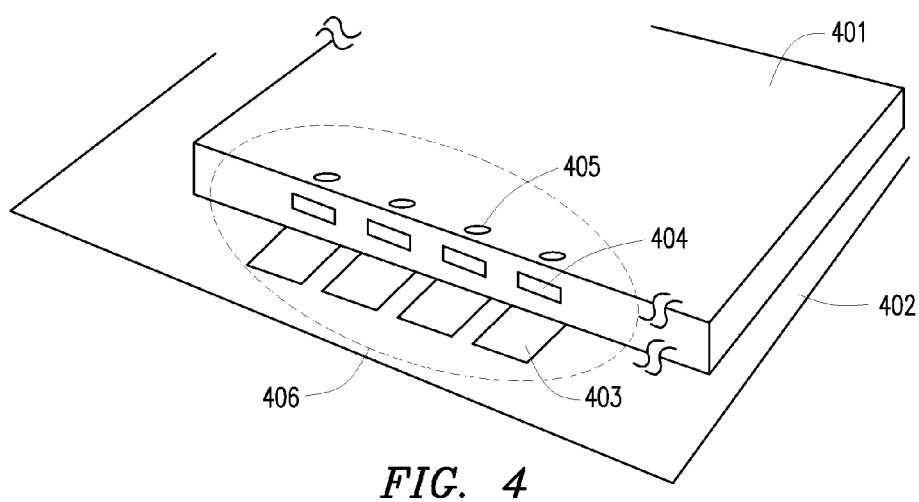
Figure 5:
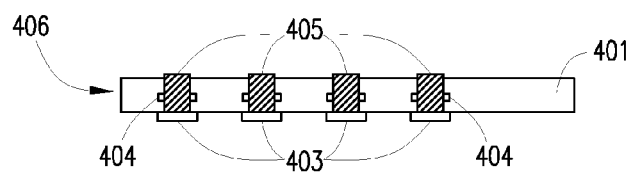

FIGS. 4 and 5 illustrate further embodiments that use TSV (Through Silicon Via) processing to provide vias 405 that connect the lateral pad metals 404 to contact points 403 on a conventional package substrate 402 of a chip 401. FIG. 5 shows a cross-sectional detail of a portion 406 of FIG. 4. It will be noted that, in such TSV embodiments, the exposure of the lateral pad metal 404 at the edge of the chip 401 is not strictly necessary for the desired TSV connection to the contact points 403 of the package substrate 402.

Figure 6:
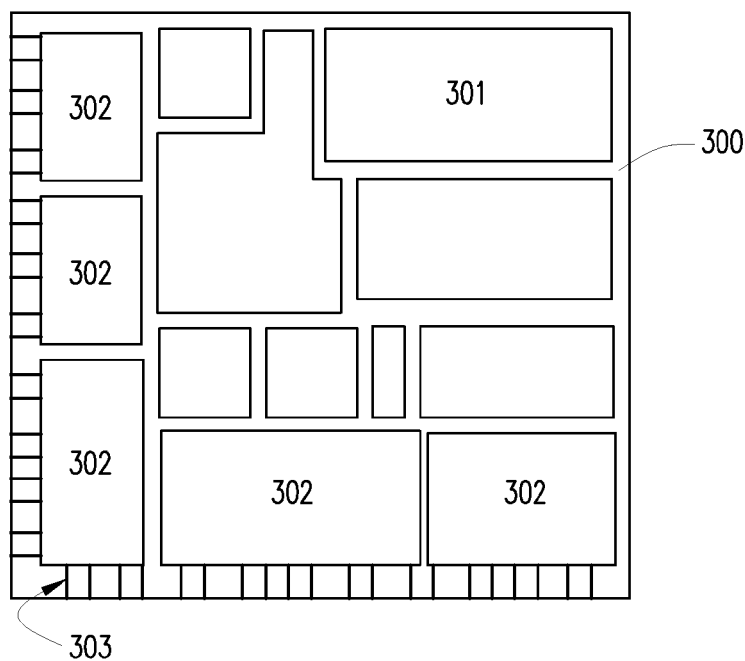
Figure 7:
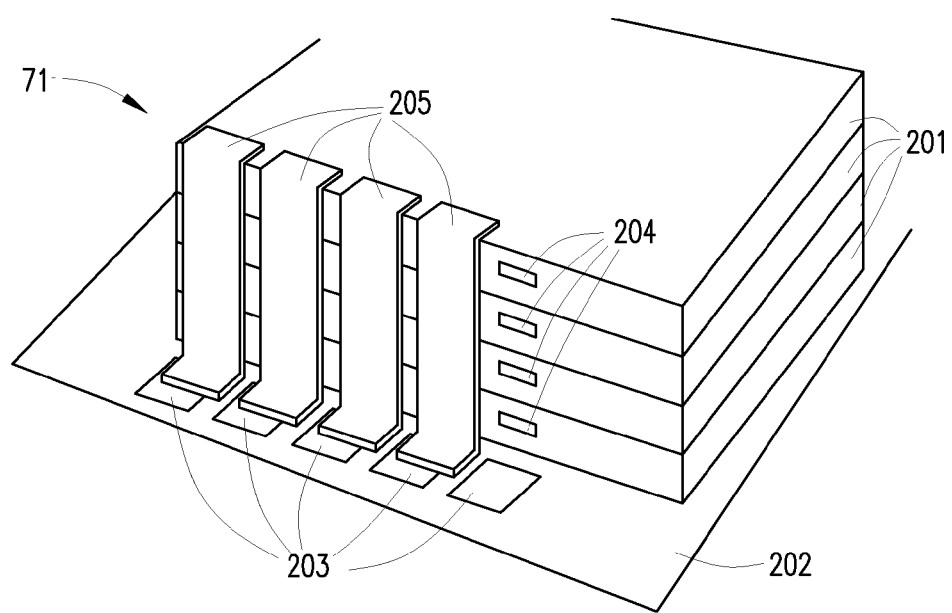
FIG. 7 diagrammatically illustrates a stack of interconnected integrated circuit chips with lateral pads provided for packaging together according to example embodiments of the present work.

FIG. 6 diagrammatically illustrates metal paths 303 (on various different metal layers of the chip in some embodiments) extending from internal circuitry 301, 302 of a chip 300 to the edges of the chip, to provide lateral pads according to example embodiments of the present work. The length of the metal paths 303 is exaggerated for clarity of illustration. The actual length in some embodiments is less than 50 um. When the wafer is sawed, the metal paths 303 are exposed at the edges of the chip 300 after passivation, thereby forming the lateral pads. The metal mass for connecting the lateral pad to the contact on the substrate (see also 205 FIG. 2) may be deposited using any suitable conventional metal deposition process. The wafer is thin enough that the lateral void effect of deposition will be negligible. Some embodiments use a conventional physical vapor deposition (PVD) process to form the metal mass. The process is readily extended to multiple chip connections where the chips 201 are stacked vertically as shown at 71 in FIG. 7.

Referring to FIGS. 3-5 and 7, once the lateral pad structures are connected to the contact points on the package substrate, conventional integrated circuit packaging techniques may be used to package the illustrated integrated circuit apparatus. The result is a packaged integrated circuit apparatus whose internal circuitry is connected to the contact points of the package substrate in one of the manners shown in FIGS. 3-5 and 7, rather than by wires connected to bond pads on the top metal layer of the integrated circuit apparatus as in the prior art. The contact points on the package substrate are electrically accessible via external terminals (not explicitly shown in the drawings) of the packaged integrated circuit apparatus, which external terminals (e.g., pins) are connected to the contact points according to the particular packaging technique.

Figure 8:
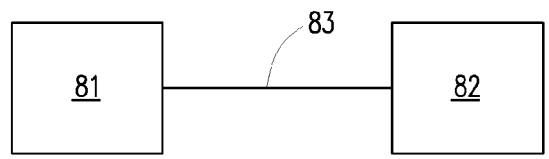
FIG. 8 diagrammatically illustrates an electronic circuit apparatus including an integrated circuit apparatus from one of FIGS. 2-4 and 7 according to example embodiments of the present work.

External circuitry may be connected to the packaged integrated circuit apparatus according to the present work in any manner that would be suitable for connecting the external circuitry to a conventional packaged integrated circuit apparatus. FIG. 8 diagrammatically illustrates an example embodiment of the resulting electronic circuit apparatus. In FIG. 8, a packaged integrated circuit apparatus 81 may include a lateral pad arrangement of the type described above relative to one of FIGS. 3-5 and 7. External circuitry 82 is connected to the packaged integrated circuit apparatus 81 by any suitable connection structure 83. The external circuitry 82 may contain one or more packaged integrated circuit apparatus, or circuitry other than packaged integrated circuit apparatus, or a combination of packaged integrated circuit apparatus and circuitry other than packaged integrated circuit apparatus.

Although example embodiments of the invention have been described above in detail, this does not limit the scope of the invention, which can be practiced in a variety of embodiments.

What is claimed is:

1. An integrated circuit apparatus, comprising:
   electronic circuitry;
   an edge produced by separation of said integrated circuit apparatus from a wafer that contains other integrated circuit apparatus; and
   a plurality of conductors connected to said electronic circuitry and physically accessible on said edge, said conductors formed before passivation and positioned to be exposed on said edge upon occurrence of said separation.

2. The integrated circuit apparatus of claim 1, including a plurality of different metal layers, and wherein one of said conductors is provided in one of said metal layers and another of said conductors is provided in another of said metal layers.

3. The integrated circuit apparatus of claim 2, wherein one of said conductors has a different cross-sectional area than another of said conductors.

4. The integrated circuit apparatus of claim 1, wherein one of said conductors has a different cross-sectional area than another of said conductors.

5. The integrated circuit apparatus of claim 1, including a package substrate having a plurality of conductive contacts, and including a plurality of conductive connection structures, each said connection structure connecting a respective one of said contacts to a respective one of said conductors.

6. The integrated circuit apparatus of claim 5, wherein said connection structures are physically deposited on said edge.

7. The integrated circuit apparatus of claim 5, wherein said connection structures are vias spaced apart from said edge.

8. An electronic circuit apparatus, comprising:
   a first electronic circuitry portion;
   an integrated circuit apparatus including a second electronic circuitry portion, an edge produced by separation of said integrated circuit apparatus from a wafer that contains other integrated circuit apparatus, and a plurality of conductors connected to said second electronic circuitry portion and physically accessible on said edge, said conductors formed before passivation and positioned to be exposed on said edge upon occurrence of said separation; and
   a conductive connection structure connected to said first electronic circuitry portion and physically attached to said conductors on said edge.

9. The apparatus of claim 8, wherein said first electronic circuitry portion is provided in a further integrated circuit apparatus that includes a further edge produced by a further separation of said further integrated circuit apparatus from a wafer that contains other integrated circuit apparatus,
   said further integrated circuit apparatus including a plurality of further conductors connected to said first electronic circuitry portion, said further conductors positioned to be exposed on said further edge upon occurrence of said further separation,
wherein said further integrated circuit apparatus is packaged together with said integrated circuit apparatus on a common package substrate, and
wherein said connection structure is physically attached to said further conductors on said further edge.

10. The apparatus of claim 8, wherein said integrated circuit apparatus includes a plurality of different metal layers, and wherein one of said conductors is provided in one of said metal layers and another of said conductors is provided in another of said metal layers.

11. The apparatus of claim 10, wherein one of said conductors has a different cross-sectional area than another of said conductors.

12. The apparatus of claim 8, wherein one of said conductors has a different cross-sectional area than another of said conductors.

* * * * *